United States Patent
Hosomi et al.

(10) Patent No.: US 9,583,673 B2
(45) Date of Patent: *Feb. 28, 2017

(54) SEMICONDUCTOR LIGHT EMITTING DEVICE INCLUDING GAAS SUBSTRATE

(71) Applicant: ROHM CO., LTD., Kyoto-fu (JP)

(72) Inventors: Tadahiro Hosomi, Kyoto (JP); Kentaro Mineshita, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 65 days.

This patent is subject to a terminal disclaimer.

(21) Appl. No.: 14/942,875

(22) Filed: Nov. 16, 2015

(65) Prior Publication Data

US 2016/0072006 A1 Mar. 10, 2016

Related U.S. Application Data

(63) Continuation of application No. 14/603,417, filed on Jan. 23, 2015, now Pat. No. 9,214,603, which is a (Continued)

(30) Foreign Application Priority Data

Jan. 5, 2007 (JP) .................... 2007-000586
Feb. 14, 2007 (JP) .................... 2007-033418

(51) Int. Cl.
*H01L 21/3205* (2006.01)
*H01L 21/28* (2006.01)
*H01L 33/00* (2010.01)
*H01L 33/10* (2010.01)
*H01L 33/30* (2010.01)
*H01L 33/46* (2010.01)
*H01L 33/06* (2010.01)

(52) U.S. Cl.
CPC .......... *H01L 33/0079* (2013.01); *H01L 33/06* (2013.01); *H01L 33/10* (2013.01); *H01L 33/30* (2013.01); *H01L 33/46* (2013.01); *H01L 2933/0016* (2013.01)

(58) Field of Classification Search
CPC . H01L 2924/01013; H01L 2924/01015; H01L 2924/01033; H01L 2924/01049; H01L 2924/10329; H01L 2924/10336; H01L 2924/10349; H01L 31/16; H01L 33/10; H01L 33/46
USPC ................. 438/47, 191, 604, 606, 694, 695, 438/FOR. 157, FOR. 416
See application file for complete search history.

(56) References Cited

U.S. PATENT DOCUMENTS 4,339,689 A * 7/1982 Yamanaka .......... G02B 6/4206
257/618
5,633,527 A * 5/1997 Lear .................. G02B 6/12004
257/101

(Continued)

FOREIGN PATENT DOCUMENTS

JP 11-168236 6/1999

*Primary Examiner* — Kyoung Lee
*Assistant Examiner* — Joannie A Garcia
(74) *Attorney, Agent, or Firm* — Rabin & Berdo, P.C.

(57) ABSTRACT

A semiconductor light emitting device including: a substrate made of GaAs; and a semiconductor layer formed on the substrate, in which part of the substrate on a side opposite to the semiconductor layer is removed by etching so that the semiconductor light emitting device has a thickness of not more than 60 μm.

20 Claims, 6 Drawing Sheets

Related U.S. Application Data continuation of application No. 14/170,675, filed on Feb. 3, 2014, now Pat. No. 8,981,431, which is a continuation of application No. 12/007,005, filed on Jan. 4, 2008, now Pat. No. 8,680,586.

(56) References Cited

U.S. PATENT DOCUMENTS

| | | |
|---|---|---|
| 6,399,967 B1 * | 6/2002 | Matsuda ............ H01L 31/02162 |
| | | 257/184 |
| 7,674,717 B2 | 3/2010 | Wang et al. |
| 2002/0113235 A1 | 8/2002 | Udagawa |
| 2002/0185653 A1 * | 12/2002 | Kurahashi .............. B82Y 20/00 |
| | | 257/99 |
| 2004/0080685 A1 | 4/2004 | Yamada et al. |
| 2004/0259331 A1 | 12/2004 | Ogihara et al. |
| 2004/0265594 A1 | 12/2004 | Terada et al. |
| 2005/0167812 A1 | 8/2005 | Yoshida et al. |
| 2006/0151793 A1 | 7/2006 | Nagai |
| 2006/0192211 A1 * | 8/2006 | Kako ...................... H01L 33/10 |
| | | 257/79 |
| 2006/0220544 A1 | 10/2006 | Okuyama et al. |
| 2007/0072004 A1 | 3/2007 | Sakai et al. |
| 2007/0082486 A1 * | 4/2007 | Yang .................... C30B 29/403 |
| | | 438/666 |
| 2009/0121242 A1 | 5/2009 | Watanabe et al. |
| 2009/0278144 A1 | 11/2009 | Sonobe et al. |

\* cited by examiner

… (1)

SEMICONDUCTOR LIGHT EMITTING DEVICE INCLUDING GAAS SUBSTRATE

CROSS REFERENCE TO RELATED APPLICATIONS AND INCORPORATION BY REFERENCE

This is a Continuation of U.S. application of Ser. No. 14/603,417, filed on Jan. 23, 2015, and allowed on Aug. 14, 2015 and issued as U.S. Pat. No. 9,214,603, which was a Continuation of U.S. application Ser. No. 14/170,675, filed on Feb. 3, 2014, and issued as a U.S. Pat. No. 8,981,431 on Mar. 17, 2015, which was a Continuation of U.S. application Ser. No. 12/007,005, filed Jan. 4, 2008, and issued as a U.S. Pat. No. 8,680,586 on Mar. 25, 2014, the subject matters of which are incorporated herein by reference.

The grandparent application Ser. No. 12/007,005 is based upon and claims the benefit of priority from prior Japanese Patent Application P2007-000586 filed on Jan. 5, 2007 and prior Japanese Patent Application P2007-033418 filed on Feb. 14, 2007; the entire contents of which are incorporated by reference herein.

BACKGROUND OF THE INVENTION

1. Field of the Invention

The present invention relates to a semiconductor light emitting device manufactured by growing semiconductor layers on a GaAs substrate and a method for manufacturing the same.

2. Description of the Related Art

A semiconductor light emitting device in which semiconductor layers including a light emitting layer composed of an InGaAlP layer or the like are stacked on a GaAs substrate is hitherto known. However, the conventional light emitting device has a problem that the output light emitted to the outside is small because the GaAs substrate absorbs light emitted by the light emitting layer. To solve the problem, there is a known technique of removing the substrate by abrasion. However, removing the substrate by abrasion causes another problem of cracks occurring in the semiconductor light emitting device cracks. Therefore, there is a disclosure of a technique to solve such a problem of cracks of the semiconductor light emitting device occurring at removal of the substrate.

For example, Japanese Patent Laid-open Publication No. 1999-168236 (Patent Literature 1) discloses a semiconductor light emitting device manufactured by growing semiconductor layers including a light emitting layer composed of an InGaAlP layer on a GaAs layer. In this semiconductor light emitting device, after the semiconductor layers are grown on the substrate, an alternate supporting member composed of a flexible and conductive film is attached to the semiconductor layer. The substrate is then removed by etching, and a metallic electrode is formed on a surface of the InGaAlP layer from which the substrate is removed to manufacture the semiconductor device.

As described above, in the semiconductor light emitting device of Patent Literature 1, the removal of the substrate reduces the absorption of light emitted from the light emitting layer, thus increasing the output light emitted to the outside.

However, the semiconductor light emitting device of Patent Literature 1 has a difficulty in forming an ohmic contact between the metallic electrode and semiconductor layers because the GaAs substrate is removed and the metallic electrode is formed on the InGaAlP layer exposed by the removal of the GaAs substrate.

SUMMARY OF THE INVENTION

A semiconductor light emitting device according to the present invention includes: a substrate made of GaAs; and a semiconductor layer formed on the substrate. Part of the substrate on a side opposite to the semiconductor layer is removed by etching so that the semiconductor light emitting device has a thickness of not more than 60 µm.

A method for manufacturing a semiconductor light emitting device according to the present invention includes: a growing step of growing a semiconductor layer on a substrate made of GaAs; an attachment step of attaching a temporary supporting substrate to a surface of the semiconductor layer opposite to the substrate with an adhesive made of polyimide system resin; and an etching step of removing part of the substrate on a side opposite to the semiconductor layer by etching so that the semiconductor light emitting device has a thickness of not more than 60 µm in a stacking direction.

According to the semiconductor light emitting device of the present invention and method for manufacturing the same, the removal of the part of the substrate made of GaAs reduces absorption of light and increases the heat radiation. Moreover, the remaining part of the substrate made of GaAs, which easily forms an ohmic contact to a metallic electrode, facilitates forming an ohmic contact of the electrode compared to the case where the substrate is entirely removed.

Moreover, since the part of the substrate is removed so that the semiconductor device has a thickness of about 60 µm in the stacking direction, even when the semiconductor light emitting device is covered with a protection film of resin or the like into a semiconductor light emitting apparatus, the semiconductor light emitting apparatus can be configured to have a thickness of not more than about 200 µm and therefore used in various applications.

DETAILED DESCRIPTION OF THE INVENTION

Figure 1:
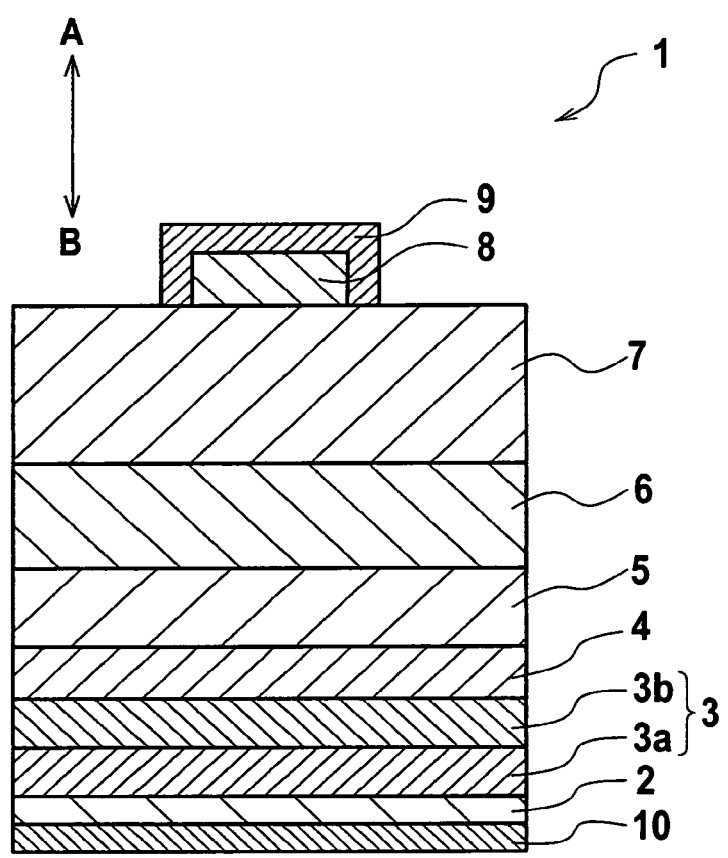
FIG. 1 is a cross-sectional view of a semiconductor light emitting device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

With reference to the drawings, a description is given of a first embodiment of the present invention. FIG. 1 is a cross-sectional view of a semiconductor light emitting device according to a first embodiment of the present invention.

As shown in FIG. 1, a semiconductor light emitting device 1 includes a substrate 2, a substrate-side reflecting layer 3 formed on the substrate 2, an n-type clad layer 4, a light emitting layer 5, p-type clad layer 6, a p-type contact layer 7, and an electrode-side reflecting layer 8. The semiconductor light emitting device 1 further includes a pair of a p-side electrode 9 and an n-side electrode 10. The semiconductor light emitting device 1 is configured to have a thickness of not more than about 60 μm in a stacking direction.

The substrate 2 is made of n-type GaAs. The substrate 2 is etched to a thickness of about 1 μm in the stacking direction (a direction indicated by an arrow A-B) so that the total thickness of the semiconductor light emitting device 1 in the stacking direction is not more than about 60 μm.

The substrate-side reflecting layer 3 includes first and second reflecting layers 3a and 3b.

The first reflecting layer 3a is to increase a light reflection bandwidth. Increasing the light reflection bandwidth means increasing incident angle of light rays which can be reflected. The first reflecting layer 3a has a Distributed Bragg Reflector (DBR) structure in which 10 pairs of about 40 nm thick n-type $Al_yIn_{1-y}P$ layers ($0.3<=y<=0.7$) and about 40 nm thick n-type GaAs layers are stacked on each other. The n-type $Al_yIn_{1-y}P$ and n-type GaAs layers are doped with silicon as an n-type dopant.

The second reflecting layer 3b is to increase reflected light intensity. The second reflecting layer 3b has a DBR structure in which 10 pairs of alternating about 40 nm thick n-type $Al_yIn_{1-y}P$ layers ($0.3<=y<=0.7$) and about 40 nm thick n-type $(Al_xGa_{1-x})_{0.5}In_{0.5}P$ layers ($0.3<=x<=0.85$) are stacked on each other. The n-type $Al_yIn_{1-y}P$ and n-type $(Al_xGa_{1-x})_{0.5}In_{0.5}P$ layers are doped with silicon as an n-type dopant.

The n-type clad layer 4 is composed of an about 1 μm thick n-type $Al_yIn_{1-y}P$ layer ($0.3<=y<=0.7$) doped with selenium as an n-type dopant.

The light emitting layer 5 emits light with a wavelength of about 540 to 650 nm. The light emitting layer 5 has a multi-quantum well structure in which 60 pairs of alternating well layers each composed of an $(Al_pGa_{1-p})_qIn_{1-q}P$ layer ($0<=p<=0.5$, $0.3<=q<=0.7$) with a thickness of about 2 to 20 nm and barrier layers each composed of $(Al_rGa_{1-r})_sIn_{1-s}P$ layers ($0<=r<=1$, $0.3<=s<=0.7$) with a thickness of about 3 to 30 nm are stacked on each other.

The p-type clad layer 6 is composed of an about 1 μm thick p-type $Al_{0.5}In_{0.5}P$ layer doped with zinc as a p-type dopant.

The p-type contact layer 7 is composed of an about 20 to 40 μm thick p-type GaP layer doped with zinc as a p-type dopant.

The electrode-side reflecting layer 8 has a DBR structure in which 5 to 10 pairs of alternating about 40 nm thick p-type $Al_yIn_{1-y}P$ layers ($0.3<=y<=0.7$) doped with zinc as a p-type dopant and p-type $(Al_{0.3}Ga_{0.7})_{0.5}In_{0.5}P$ layers are stacked on each other. The electrode-side reflecting layer 8 has a circular shape in a plan view and is formed on a part of the p-type contact layer 7.

The p-side electrode 9 forms an ohmic contact to the p-type contact layer 7 and electrode-side reflecting layer 8. The p-side electrode 9 has a stacking structure of AuBe/Au with a thickness of about 3000 nm. The material of the p-side electrode 9 can be AuZn instead of AuBe. As shown in FIG. 1, the p-side electrode 9 has a square U-shape open downward in a side cross-sectional view and a circular shape with a diameter larger than that of the electrode-side reflecting layer 8 in a plan view. In other words, the p-side electrode 9 covers upper and side surfaces of the electrode-side reflecting layer 8, and a part of a bottom surface of the p-side electrode 9 is in contact with the p-type contact layer 7.

The n-side electrode 10 forms an ohmic contact to a rear surface of the substrate 2. The n-side electrode 10 has a stacking structure of AuGe/Au with a thickness of about 1000 nm.

Next, a description is given of an operation of the aforementioned semiconductor light emitting device.

When the semiconductor light emitting device 1 is supplied with current through the p-side and n-side electrodes 9 and 10, first, holes are supplied from the p-side electrode 9, and electrons are supplied from the n-side electrode 10. Herein, most of the holes supplied from the p-side electrode 10 are injected not through the electrode-side reflecting layer 8 but directly into the p-type contact layer 7 and then injected through the p-type clad layer 6 into the light emitting layer 5. The electrons are injected through the substrate-side reflecting layer 3 and n-type clad layer 4 into the light emitting layer 5. The holes and electrons injected into the light emitting layer 5 are recombined to each other to emit light with a wavelength of about 540 to 650 nm.

Herein, light rays traveling in the direction A are transmitted through the p-type clad layer 6 and p-type contact layer 7 to reach the upper surface of the p-type contact layer 7. Among the light rays which have reached the upper surface of the p-type contact layer, light rays which have reached an area other than the electrode-side reflecting layer 8 are radiated to the outside while light rays which have reached the electrode-side reflecting layer 8 are reflected on the electrode-side reflecting layer 8 to travel in the direction B without being absorbed by the p-side electrode 9.

Among the light rays traveling in the direction B, most of light rays having small incident angles are reflected on the second reflecting layer 3. However, light rays with large incident angles are not reflected on the second reflecting layer 3 and transmitted through the second reflecting layer 3b to be incident on the first reflecting layer 3a. Herein, the incident angle of light rays which can be reflected by the first reflecting layer 3a is larger than that of the second reflecting layer 3b. Accordingly, even light rays which have large incident angle and cannot be reflected on the second reflecting layer 3b can be reflected by the first reflecting layer 3a. The light rays reflected on the second and first reflecting layers 3b and 3a travel in the direction A to be transmitted through the layers from the n-type clad layer 4 to the p-type contact layer 7 and radiated to the outside.

In the semiconductor light emitting device 1, the GaAs substrate 2 is partially removed so as to have a thickness of about 1 μm. The absorption of light emitted by the light emitting layer 5 is therefore reduced to increase the output light emitted to the outside. Moreover, heat radiation is increased, and it is therefore possible to prevent a shift of wavelength of emitted light due to an increase in temperature of the semiconductor light emitting device 1. As the heat radiation increases, light emission intensity of the semiconductor light emitting device 1 increases.

Next, a description is given of a method for manufacturing the aforementioned semiconductor light emitting device. FIGS. 2 to 7 are cross-sectional views of the semiconductor light emitting device at respective manufacturing steps.

First, the substrate 2 of n-type GaAs is put in an MOCVD apparatus. Temperature of the substrate 2 is set to about 600 to 800° C., preferably about 700° C.

Figure 2:
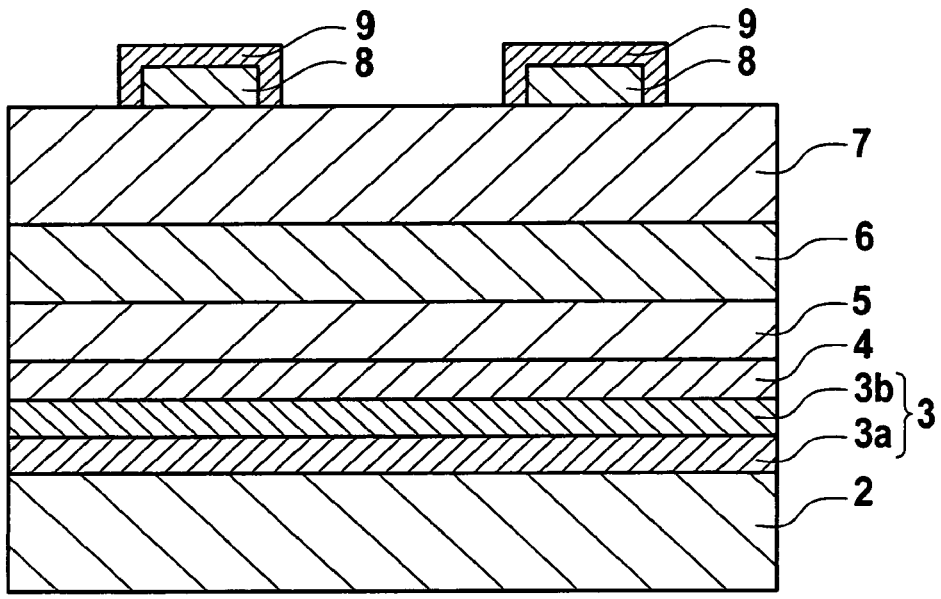
FIG. 2 is a cross-sectional view of the semiconductor light emitting device at a step of a manufacturing process.

Next, as shown in FIG. 2, trimethylaluminum (hereinafter, TMA), trimethylindium (hereinafter, TMI), phosphine, and monosilane are supplied with carrier gas ($H_2$ gas) to the MOCVD apparatus to form an about 40 nm thick n-type layer doped with silicon. Trimethylgallium (hereinafter, TMG), arusine, and monosilane are supplied to form an about 40 nm thick n-type GaAs layer doped with silicon. Such a process is repeated to stack 10 pairs of alternating n-type $Al_yIn_{1-y}P$ and n-type GaAs layers, thus forming the first reflecting layer 3a.

Next, TMA, TMI, phosphine, and monosilane are supplied with the carrier gas to form an about 40 nm thick n-type $Al_yIn_{1-y}P$ layer doped with silicon. Thereafter, TMA, TMG, TMI, phosphine, and monosilane are supplied to form an about 40 nm thick n-type $(Al_xGa_{1-x})_{0.5}In_{0.5}P$ layer. Such a process is repeated to stack 10 pairs of alternating n-type $Al_yIn_{1-y}P$ and $(Al_xGa_{1-x})_{0.5}In_{0.5}P$ layers, thus forming the second reflecting layer 3b.

Next, TMA, TMI, phosphine, and hydrogen selenide are supplied with the carrier gas to form the n-type clad layer 4 composed of an about 1 μm thick n-type $Al_yIn_{1-y}P$ layer doped with selenium.

Next, TMI, TMG, and phosphine are supplied with the carrier gas to form the well layer composed of an $(Al_pGa_{1-p})_qIn_{1-q}P$ layer having a thickness of about 2 to 20 nm. Thereafter, TMA, TMG, TMI, and phosphine are supplied to form the barrier layer composed of an $(Al_rGa_{1-r})_sIn_{1-s}P$ layer having a thickness of about 3 to 30 nm. Such a process is repeated to stack 60 pairs of alternating well and barrier layers are stacked, thus forming the light emitting layer 5.

Next, TMA, TMI, phosphine, and dimethylzinc are supplied with the carrier gas to form the p-type clad layer 6 composed of an about 1 μm thick p-type $Al_{0.5}In_{0.5}P$ layer doped with zinc.

Next, TMG, phosphine, and dimethylzinc are supplied with the carrier gas to form the p-type contact layer 7 composed of an about 20 to 40 μm thick p-type GaP layer doped with zinc.

Next, TMA, TMI, phosphine, and dimethyl zinc are supplied to form an about 40 nm thick p-type $Al_yIn_{1-y}P$ layer doped with zinc. Thereafter, TMA, TMG, TMI, phosphine, and dimethylzinc are supplied to form an about 40 nm thick p-type $(Al_{0.3}Ga_{0.7})_{0.5}In_{0.5}P$ layer doped with zinc. Such a process is repeated to stack 5 to 10 pairs of alternating p-type $Al_yIn_{1-y}P$ and p-type $(Al_{0.3}Ga_{0.7})_{0.5}In_{0.5}P$ layers, thus forming a DBR structure. The DBR structure is then patterned by photolithography and etching to form the electrode-side reflecting layer 8.

Next, an about 3000 nm thick stacking structure of AuBe (or AuZn)/Au is formed by spattering so as to cover the upper surface of the p-type contact layer 7 and the upper and side surfaces of the electrode-side reflecting layer 8. The stacking structure is then patterned using photolithography and etching to form the p-side electrodes 9.

Figure 3:
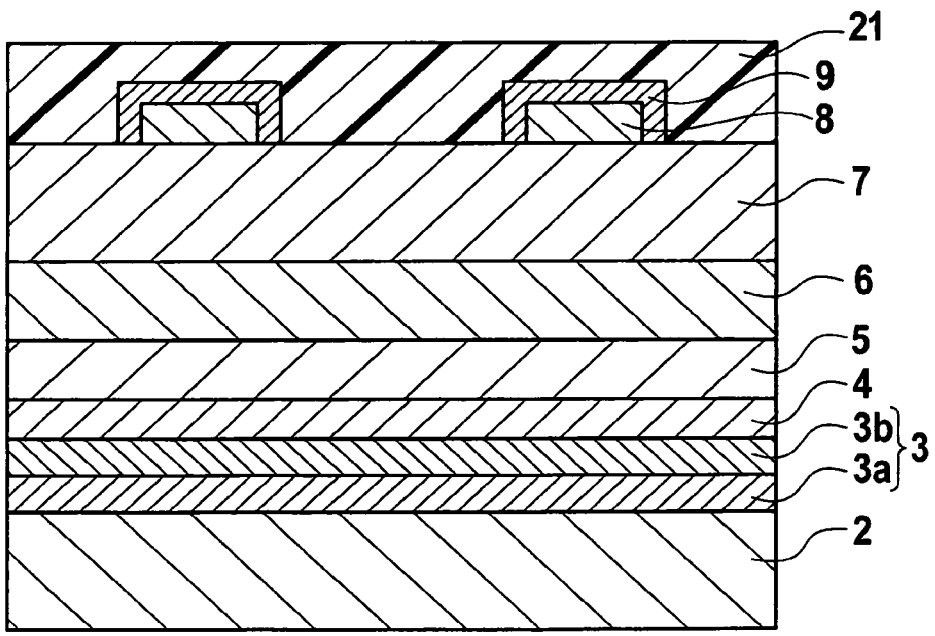
FIG. 3 is a cross-sectional view of the semiconductor light emitting device at another step of the manufacturing process.

Next, as shown in FIG. 3, an adhesive 21 composed of polyimide system resin is applied by spin coating to entire exposed surfaces of the p-type contact layer 7 and p-side electrodes 9 and then heated at about 115° C. for about 5 minutes to evaporate the solvent. Herein, an example of polyimide system resin used for the adhesive 21 can be a mixture of about 70% to 95% 1-methyl-2pyrrolidinone (NMP) and about 5 to 30% polyamic acid resin.

Figure 4:
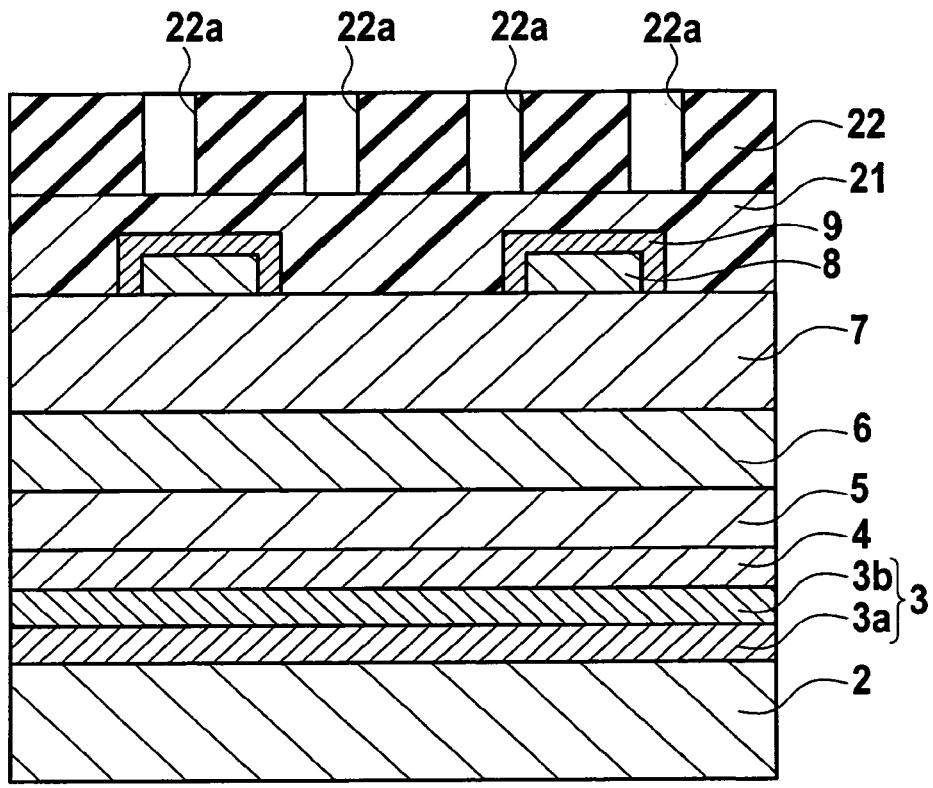
FIG. 4 is a cross-sectional view of the semiconductor light emitting device at still another step of the manufacturing process.

Next, as shown in FIG. 4, on the adhesive 21, a temporary supporting substrate 22 which is made of quartz or sapphire and includes the plurality of holes 22a formed is placed and then heated at about 115° C. for about 5 minutes so as to be attached to the p-type contact layer 7 and p-side electrodes 9 (a surface opposite to the substrate 2) through the adhesive 21.

Figure 5:
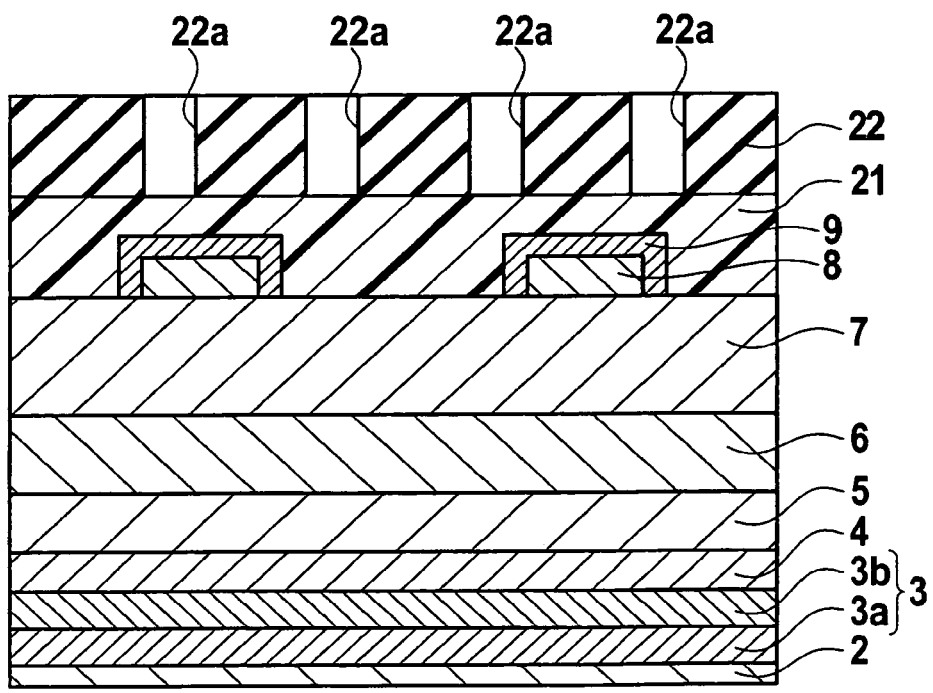
FIG. 5 is a cross-sectional view of the semiconductor light emitting device at still another step of a manufacturing process.

Next, as shown in FIG. 5, using an acid etching solution of a mixture of $H_3PO_4$, $H_2O_2$, and $H_2O$ in a ratio of 1/1/3, the substrate 2 is etched to be removed. Herein, the substrate 2 is not entirely removed by etching and partially removed to have a thickness of about 1 μm so that a total thickness of the semiconductor light emitting device 1 in the stacking direction is not more than about 60 μm.

Figure 6:
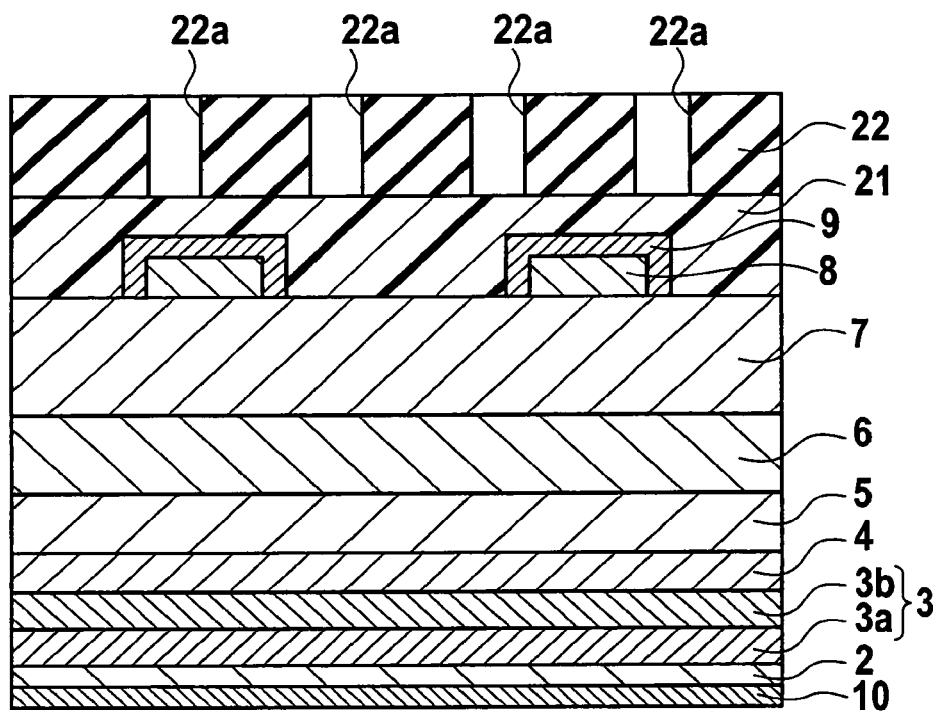
FIG. 6 is a cross-sectional view of the semiconductor light emitting device at still another step of the manufacturing process.

Next, as shown in FIG. 6, in a state where the temporary supporting substrate 22 is attached, the n-side electrode 10 composed of an about 1000 nm thick stacking structure of AuGe/Au formed on the entire lower surface of the substrate 2. Thereafter, annealing is performed to from ohmic contacts between the p-side electrodes 9 and p-type contact layer 7 and the n-side electrode 10 and substrate 2.

Figure 7:
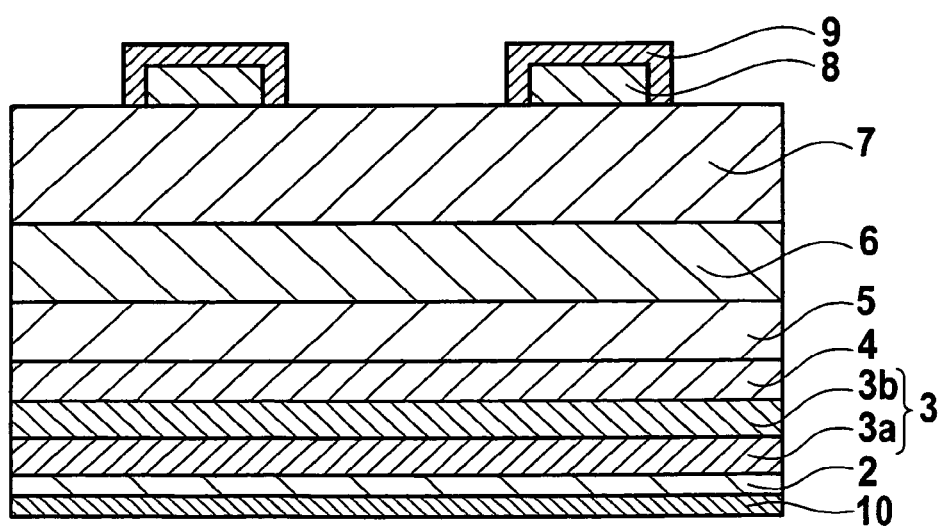
FIG. 7 is a cross-sectional view of the semiconductor light emitting device at a still another step of the manufacturing process.

Next, as shown in FIG. 7, the adhesive 21 composed of polyimide system resin is dissolved using an alkali solution with a concentration of about 1% such as a KOH aqueous solution to separate the temporary supporting substrate 22. Herein, the alkali solution enters not only through the periphery of the temporary supporting substrate 22 but also through the plurality of holes 22a to dissolve the adhesive 21.

The thus-obtained product is eventually divided into device units, thus completing the semiconductor light emitting device 1.

As described above, in the semiconductor light emitting device 1, the GaAs substrate 2 is not entirely removed by etching and is etched so as to have a thickness of about 1 μm. Accordingly, it is possible to more easily form an ohmic contact between the n-side electrode 10 and semiconductor layers than the case where the substrate is entirely removed.

Moreover, since part of the substrate 2 is removed so that the semiconductor device 1 has a thickness of about 60 μm in the stacking direction, even when the semiconductor light emitting device 1 is covered with a protection film of resin or the like into a semiconductor light emitting apparatus, the semiconductor light emitting apparatus can be configured to have a thickness of not more than about 200 μm and therefore used in various applications.

Furthermore, use of the adhesive 21 made of polyimide system resin for attachment of the temporary supporting substrate 22 can provide the following effects. First, since polyimide system resin constituting the adhesive 21 is highly resistant to acid, the adhesive 21 is prevented from being dissolved by the acid etching solution used in etching the substrate 2. Secondly, since the polyimide system resin constituting the adhesive 21 is highly resistant to heat, the annealing to form ohmic contacts of the electrodes 9 and 10 can be performed even with the temporary supporting substrate 22 attached. Thirdly, since the polyimide system resin constituting the adhesive 21 easily dissolves in alkali solution, the adhesive 21 can be easily dissolved by the alkali solution such as KOH solution for separating the temporary supporting substrate 2.

Moreover, since the n-side electrode 10 is formed and annealing to form an ohmic contact is performed in a state where the temporary supporting substrate 22 is attached, cracks of the semiconductor light emitting device 1 can be prevented.

Furthermore, since the temporary supporting substrate 22 provided with the plurality of holes 22 is used, the alkali solution to dissolve the adhesive 21 can be injected through the individual holes 22a, and the adhesive 21 can be quickly dissolved.

Figure 8:
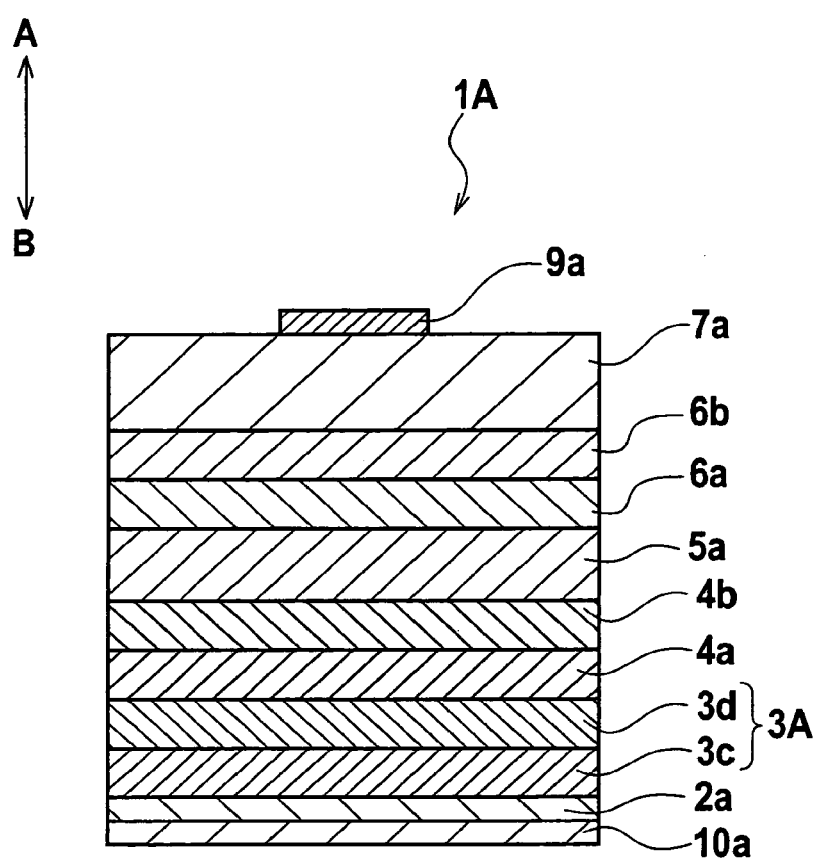
FIG. 8 is a cross-sectional view of a semiconductor light emitting device according to a second embodiment of the present invention.

Next, with reference to the drawing, a description is given of a second embodiment obtained by partially modifying the aforementioned first embodiment. FIG. 8 is a cross-sectional view of a semiconductor light emitting device according to the second embodiment. Same components as those of the first embodiment are given same reference numerals, and a description thereof is omitted.

As shown in FIG. 8, a semiconductor light emitting device 1A includes a substrate 2a made of n-type GaAs doped with silicon, a substrate-side reflecting layer 3A laid on the substrate 2a, a first n-type clad layer 4a, a second n-type clad layer 4b, a light emitting layer 5a, a first p-type clad layer 6a, a second p-type clad layer 6b, and a p-type contact layer 7a. The semiconductor light emitting device 1A further includes a p-side electrode 9a and an n-side electrode 10.

The semiconductor light emitting device 1A has a square shape of about 100 μm×about 100 μm in a plan view. The semiconductor light emitting device 1A is configured to have a thickness of not more than 60 μm (preferably, not more than 40 μm) in the stacking direction.

The substrate-side reflecting layer 3A includes a first reflecting layer 3c and a second reflecting layer 3d.

The first reflecting layer 3c has an about 870 nm thick DBR structure in which 10 pairs of alternating about 45 nm thick n-type AlInP layers and about 42 nm thick n-type GaAs layers are stacked on each other. The n-type AlInP and n-type GaAs layers are doped with silicon as an n-type dopant.

The second reflecting layer 3d has an 900 nm thick DBR structure in which 10 pairs of alternating about 45 nm thick n-type AlInP layers and about 45 nm thick n-type $Al_{0.3}Ga_{0.7}InP$ layers are stacked on each other. The n-type AlInP and n-type $Al_{0.3}Ga_{0.7}InP$ layers are doped with selenium as an n-type dopant.

The first n-type clad layer 4a is composed of an about 800 nm thick n-type $Al_{0.7}Ga_{0.3}InP$ layer doped with selenium as an n-type dopant. The second n-type clad layer 4b is composed of an about 400 nm thick n-type AlInP layer doped with selenium as an n-type dopant.

The light emitting layer 5a has an about 1080 nm thick MQW structure in which 65 pairs of alternating well layers each composed of an about 4.5 nm thick GaInP layer and barrier layers each composed of an about 12 nm thick AlGaInP layer are stacked on each other. Between the light emitting layer 5a and second n-type clad layer 4b, an n-type guide layer (not shown) composed of an about 100 nm thick n-type AlGaInP layer is formed. Between the light emitting layer 5a and first p-type clad layer 6a, a p-type guide layer (not shown) composed of an about 100 nm thick p-type AlGaInP layer is formed.

The first p-type clad layer 6a is composed of an about 450 nm $Al_{0.85}Ga_{0.15}InP$ layer doped with zinc as a p-type dopant.

The second p-type clad layer 6b is composed of an about 450 nm thick AlInP layer doped with zinc as a p-type dopant.

The p-type contact layer 7a has a thickness of $D_1$ μm ($2<=D_1<=10$) and is composed of a p-type GaP layer doped with zinc as a p-type dopant.

The p-side electrode 9a is formed on a part of an upper surface of the p-type contact layer 7a so as to form an ohmic contact to the same. The p-side electrode 9a has a stacking structure of AuBe/Au with a thickness of about 3000 nm. The material of the p-side electrode 9a can be AuZn instead of AuBe.

The semiconductor light emitting device 1A according to the second embodiment has a total thickness of about 8.55 μm except the substrate 2a and p-type contact layer 7a. To make the total thickness of the semiconductor light emitting device 1A not more than 60 μm, part of the substrate 2a is removed by etching in the stacking direction so that $D_2$ satisfies the following equation:

$$D_2=80-8.55-D_1=51.45-D_1 \ [\mu m]$$

where $D_2$ is a thickness of the substrate 2a.

As described above, the semiconductor light emitting device 1A according to the second embodiment, in which part of the substrate 2a is removed by etching in the stacking direction so that the total thickness of the device is not more than 60 μm, has the same effects as those of the semiconductor light emitting device 1 of the first embodiment.

Hereinabove, the present invention is described in derail using the embodiments but not limited to the embodiments described in this specification. The scope of the present invention is determined based on the scope of claims and their equivalents. In the following, a description is given of modifications obtained by partially modifying the aforementioned embodiments.

For example, the thicknesses of the semiconductor light emitting device 1 and substrate 2 are just examples and can be properly changed. As an example, the thickness of the substrate may be set between 1 and 45 μm (preferably, 10 μm or more) so that the total thickness of the device is not more than 60 μm (preferably, not less than 35 μm and not more than 50 μm) in the stacking direction. Moreover, the thickness of the p-type contact layer in the stacking direction can be changed between 2 and 10 μm, for example.

Furthermore, the thickness and materials of each semiconductor layer stacked on the substrate 2 are just examples and can be properly changed. For example, the light emitting layer may be composed of a GaAs or AlGaAs semiconductor layer or composed of a MQW structure in which a InGaAs semiconductor layer and a GaAs or AlGaAs semiconductor layer are alternately stacked on each other. In the case where the light emitting layer has such a MQW structure, the number of pairs of well and barrier layers may be properly changed.

In the method of manufacturing the semiconductor device, the etching solution used to etch the substrate 2 can be ammonium, HF, $H_2SO_4$ type etching solution.

Figure 9:
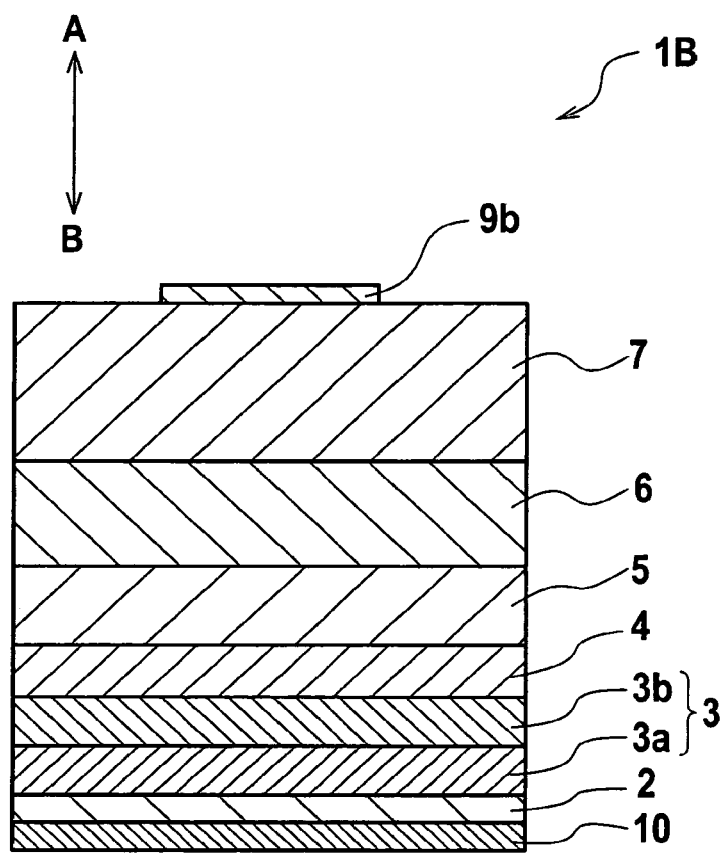
FIG. 9 is a cross-sectional view of a semiconductor light emitting device according to a modification of the present invention.

Moreover, like a semiconductor light emitting device 1B shown in FIG. 9, the electrode-side reflecting layer 8 in the aforementioned semiconductor light emitting device 1 may be omitted while a p-side electrode 9b is directly formed on the p-type contact layer 7. In such a structure, the substrate 2 may be increased in thickness by the thickness of the electrode-side reflecting layer 8.

In the aforementioned semiconductor light emitting device 1 (1A), the substrate-side reflecting layer 3 (3A) is composed of the two reflecting layers 3a and 3b (3c and 3d)

but may be composed of a single reflecting layer. Moreover, the substrate-side reflecting layer 3 (3A) may be omitted.

What is claimed is:

1. A method for manufacturing a semiconductor light emitting device, the method comprising:
   growing a semiconductor layer on a substrate made of GaAs;
   attaching a temporary supporting substrate to a surface of the semiconductor layer opposite to the substrate with an adhesive made of polyimide system resin;
   removing a whole surface of the substrate by etching so that a thickness of the substrate is reduced down to approximately 1 µm; and
   after the etching, forming a metallic electrode on the etched surface of the substrate in a state where the temporary supporting substrate is still attached to the semiconductor layer.

2. The method of claim 1, wherein the part of the substrate is removed by the etching so that a total thickness in a stacking direction of the semiconductor light emitting device is not more than approximately 60 µm.

3. The method of claim 1 further comprising annealing the metallic electrode in the state where the temporary supporting substrate is still attached to the semiconductor layer.

4. The method of claim 1, wherein in the etching, the substrate is etched with acid etching solution.

5. The method of claim 1 further comprising, after the etching, removing the temporary supporting substrate.

6. The method of claim 5, wherein a plurality of holes are formed in the temporary supporting substrate.

7. The method of claim 5, wherein in the temporary supporting substrate removal, the adhesive is dissolved with alkali solution.

8. The method of claim 6, wherein in the temporary supporting substrate removal, the adhesive is dissolved with alkali solution.

9. The method of claim 1 further comprising forming the adhesive by applying polyimide system resin with spin coating and evaporating solvent.

10. The method of claim 1, wherein the semiconductor layer comprises
    a first reflecting layer disposed on the substrate,
    a second reflecting layer disposed on the first reflecting layer, and
    an n-type clad layer disposed on the second reflecting layer.

11. The method of claim 10, wherein the semiconductor light emitting device further comprises
    the first reflecting layer and the second reflecting layer each having a Distributed Bragg Reflector (DBR) structure that includes a plurality of stacked layers,
    wherein each respective layer of the DBR structures of the first and second reflecting layers has a different composition than a composition of an adjacent layer of the DBR structures of the first and second reflecting layers that is stacked on the respective layer.

12. The method of claim 11, wherein the DBR structure of the first reflecting layer includes AlInP layers and GaAs layers stacked on each other.

13. The method of claim 11, wherein the DBR structure of the second reflecting layer includes AlInP layers and AlGaInP layers stacked on each other.

14. The method of claim 12, wherein the semiconductor layer further includes
    a p-type clad layer, and
    an electrode-side reflecting layer disposed above the p-type clad layer,
    the electrode-side reflecting layer having a DBR structure which includes AlInP layers and AlGaInP layers stacked on each other.

15. The method of claim 14, wherein a p-side electrode covers an upper surface and side surfaces of the electrode-side reflecting layer.

16. The method of claim 11, wherein the DBR structure of the first reflecting layer includes $Al_yIn_{1-y}P$ layers ($0.3<=y<=0.7$) and GaAs layers stacked on each other.

17. The method of claim 16, wherein the DBR structure of the second reflecting layer includes $Al_yIn_{1-y}P$ layers ($0.3<=y<=0.7$) and $(Al_xGa_{1-x})_{0.5}In_{0.5}P$ layers ($0.3<=x<=0.85$) stacked on each other.

18. The method of claim 17, wherein the semiconductor layer further includes
    a p-type clad layer, and
    an electrode-side reflecting layer disposed above the p-type clad layer,
    the electrode-side reflecting layer having a DBR structure which includes $Al_yIn_{1-y}P$ layers ($0.3<=y<=0.7$) and $(Al_{0.3}Ga_{0.7})_{0.5}In_{0.5}P$ layers stacked on each other.

19. The method of claim 18, wherein a p-side electrode covers an upper surface and side surfaces of the electrode-side reflecting layer.

20. The method of claim 1, wherein the part of the substrate is removed by the etching so that a total thickness in a stacking direction of the semiconductor light emitting device is not less than approximately 35 µm and not more than approximately 50 µm.

* * * * *